(12) United States Patent
Hirota

(10) Patent No.: US 6,329,888 B1
(45) Date of Patent: Dec. 11, 2001

(54) REFLECTION INVERSION SURFACE ACOUSTIC WAVE TRANSDUCER AND FILTER

(75) Inventor: Kazuhiro Hirota, Kouza-gun (JP)

(73) Assignee: Toyo Communication Equipment Co., Ltd., Kanagawa (JP)

(*) Notice: Subject to any disclaimer, the term of this patent is extended or adjusted under 35 U.S.C. 154(b) by 0 days.

(21) Appl. No.: 09/381,424

(22) PCT Filed: Jan. 18, 1999

(86) PCT No.: PCT/JP99/00126

§ 371 Date: Sep. 20, 1999

§ 102(e) Date: Sep. 20, 1999

(87) PCT Pub. No.: WO99/37022

PCT Pub. Date: Jul. 22, 1999

(30) Foreign Application Priority Data

Jan. 20, 1998 (JP) .................................................. 10-023918

(51) Int. Cl.[7] .............................. H03H 9/64; H03H 9/145
(52) U.S. Cl. ....................... 333/193; 333/195; 310/313 B
(58) Field of Search .................................. 333/193, 194, 333/195, 196; 310/313 R, 313 B, 313 C, 313 D (56) References Cited

U.S. PATENT DOCUMENTS

| 3,870,975 | 3/1975 | Vasile ................................... 333/151 |
| 4,249,146 | 2/1981 | Yen et al. ............................. 333/195 |
| 4,642,506 | * 2/1987 | Lewis ............................... 310/313 D |
| 4,902,925 | * 2/1990 | Wright ............................. 333/194 X |
| 5,793,146 | * 8/1998 | Wright ............................. 333/154 X |

FOREIGN PATENT DOCUMENTS

50-126351 A  10/1975 (JP) .
61-205014  *  9/1986 (JP) ..................................... 333/193

* cited by examiner

*Primary Examiner*—Robert Pascal
*Assistant Examiner*—Barbara Summons
(74) *Attorney, Agent, or Firm*—Koda & Androlia (57) ABSTRACT

A surface acoustic wave transducer is provided having three electrode fingers disposed as one reference segment ($\lambda$) on a piezoelectric substrate, each segment including an electrode finger 1 having a width W1, an electrode finger 2 having a width W2 with a gap of g1, and an electrode 3 having a width 3 with a gap g2. The electrode fingers 1 and 3 are set in-phase, and the electrode finger 2 is set in an opposite phase for driving. Further, W1 is set equal to W3, and g1 is set equal to g2. Thus, it is possible to provide a SAW transducer that has improved a shape factor at a high-pass side near a pass band of a primary-third order longitudinally coupled double mode SAW filter.

4 Claims, 6 Drawing Sheets

REFLECTION INVERSION SURFACE ACOUSTIC WAVE TRANSDUCER AND FILTER

FIELD OF THE INVENTION

The present invention relates to a surface acoustic wave transducer (hereinafter to be referred to as an IDT electrode) and a surface acoustic wave device structured by using the same, and relates, more particularly, to a reflection reversed type surface acoustic wave transducer having three electrodes disposed in one wave length of an excited surface acoustic wave thereby to have improved a drop in attenuation generated at a high-pass side near a pass band and have improved spurious signal response in this area.

BACKGROUND ART

In recent years, a surface acoustic wave device (hereinafter to be referred to as a SAW device) has been used in many communications fields, and has been playing the role in reducing the sizes of portable telephones and the like because of its excellent characteristics in high frequency, compactness and easiness in mass production.

Figure 5A:
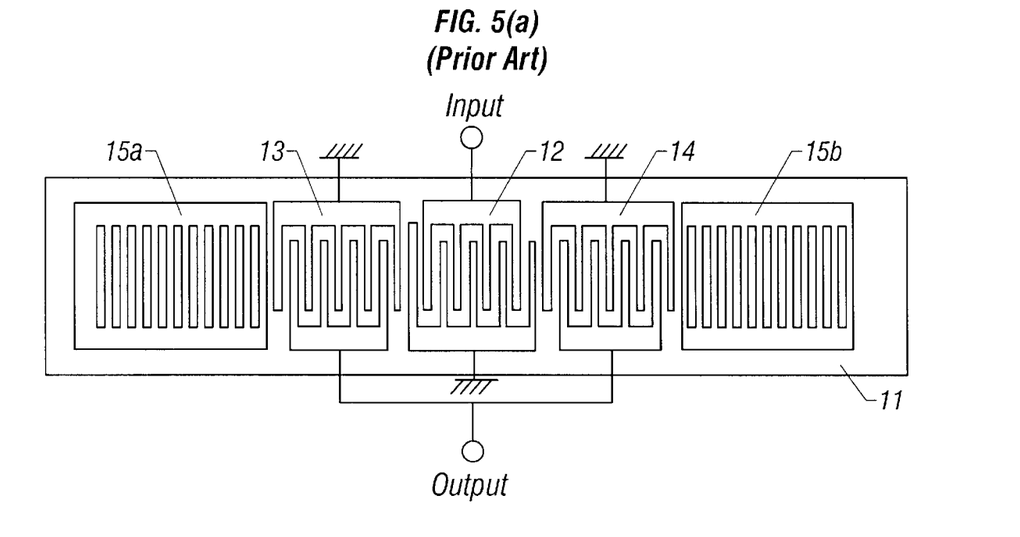
FIG. 5(a) is a top plan view for showing a structure of a conventional primary-third order longitudinally coupled mode SAW filter.

FIG. 5(a) is a top plan view for showing one example of an electrode pattern of a conventional primary-third order longitudinally coupled double mode SAW filter (hereinafter to be referred to as a double mode SAW filter). On a main surface of a piezoelectric substrate 11, there are provided three normal IDT 12, IDT 13 and IDT 14 closely disposed to each other along a propagation direction of a surface wave, with reflectors 15a and 15b disposed on both sides of these IDT's.

Each of the IDT 12, IDT 13 and IDT 14 is structured by a pair of comb electrodes having a plurality of electrode fingers, with each electrode finger inserted into a space of the other comb electrode. One of the comb electrodes of the IDT 12 is connected with an input terminal and the other comb electrode is grounded. One of the comb electrodes of the IDT 13 and one of the comb electrodes of the IDT 14 are mutually connected with each other and are connected to an output terminal. The other comb electrode of the IDT 13 and the other comb electrode of the IDT 14 are mutually connected with each other and are grounded.

The double mode SAW filter shown in FIG. 5(a) operates as follows as known. A plurality of surface waves excited by the IDT's 12, 13 and 14 are trapped between the reflectors 15a and 15b, and an acoustic coupling is generated among the IDT's 12, 13 and 14. As a result, two longitudinally coupled resonance modes of primary and third-order are excited strongly, and the filter works as a double mode SAW filter utilizing these two modes. It is known that a passing band of the double mode SAW filter is proportional to a frequency difference between the primary-order resonance mode and the third-order resonance mode.

Having a plurality of the double mode SAW filters disposed on the piezoelectric substrate and having these filters connected in cascade to improve a shape factor and guaranteed attenuation of the filter, is also a means well-known in the art.

Figure 5B:
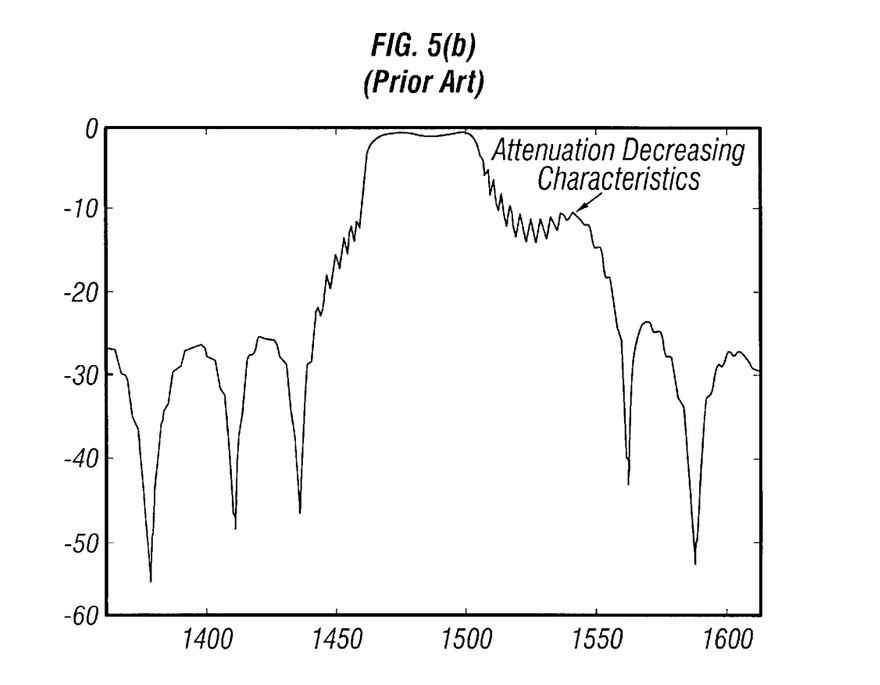
FIG. 5(b) is a characteristic diagram of the same.

FIG. 5(b) shows an example of frequency characteristics obtained as a result of simulating a double mode SAW filter, taking the IDT electrode pattern shown in FIG. 5(a) as an example, by using 360° Y-cut X-propagation LiTaO$_3$ as a piezoelectric substrate, using 18 pairs of the IDT 12, using 18 pairs of the IDT 13, using 18 pairs of the IDT 14, using 500 reflectors, assuming a pitch ratio $L_t/L_R$ of the reflectors to the IDT's as 0.990, assuming a center frequency of 1.5 GHz, and assuming a necessary pass band width as 24 MHz.

However, when an attempt is made to realize a wide-band double mode SAW filter by using the conventional normal IDT electrode pattern, the following trend is observed as is clear from the filter characteristic shown in FIG. 5(b). The shape factor at a high-pass side standardized by a center frequency is not as good as the shape factor at a low-pass side standardized by a center frequency, and the attenuation level is decreased by 13 dB at around 1.54 GHz and then increases. (A small ripple near the pass band shown in FIG. 5(b) is attributable to the reflectors 15a and 15b, and this becomes smaller after being converted into a bulk wave in the actual product. Therefore, this has no practical problem.

In order to overcome the above problem, a plurality of double mode SAW filters having similar characteristics are connected in cascade, whereby to improve the characteristics. However, it is not possible to eliminate the above-described attenuation level decreasing characteristic itself by this method, and there has been a problem that an insertion loss increases two times or three times by the known cascade connection.

Further, there has recently been a demand for narrowing an interval between channels from the needs of effective utilization of frequencies. There has also been a demand for low loss and high attenuation in the filters used. However, these demands cannot be met by the conventional double mode SAW filters that have what is called the attenuation level decreasing characteristic at the high-pass side in the vicinity of the passing band.

In order to solve the above problems, there is also proposed a ladder type SAW filter. However, this also has a problem that the use of this filter is limited as it is not possible to obtain sufficient attenuation in the frequency at a distance from the center frequency of the pass band.

With a view to solving the above-described problems, it is an object of the present invention to provide a structure of IDT electrodes and an SAW using this structure that has improved both the attenuation at a high-pass side near the passing band and spurious signal response in this area.

DISCLOSURE OF THE INVENTION

In order to achieve the above object, according to a first aspect of the present invention, there is provided a reflection reversed type surface acoustic wave transducer, structured by a repetition of a plurality of unit segments formed on a piezoelectric substrate, each segment comprising: a first electrode finger having a width W1; a second electrode finger having a width W2 disposed adjacent to the first electrode finger with a gap g1; a third electrode finger having a width W3 disposed adjacent to the second electrode finger with a gap g2; and a space of (g3)/2 disposed on both end sides of the first electrode finger and the third electrode finger respectively, wherein the first and third electrode fingers are set in-phase, with the second electrode finger set in an opposite phase, the width W1 of the first electrode finger and the width W3 of the third electrode finger are set equal to each other, and the gap g1 and the gap g2 are set equal to each other. (Corresponding to claim 1)

According to a second aspect of the invention, there is provided a longitudinally coupled multi mode SAW filter, wherein a plurality of surface acoustic wave transducers in the above first aspect of the invention are disposed close to each other along a propagation direction of a surface wave, with reflectors disposed on both sides thereof. (Corresponding to claim 2)

According to a third aspect of the invention, there is provided a longitudinally coupled multi mode SAW filter, wherein a plurality of surface acoustic wave transducers in the above first aspect of the invention are disposed close to each other along a propagation direction of a surface wave, with reflectors disposed on both sides thereof, and a ratio of a pitch of the reflectors to a pitch of the IDT's is set larger than 1. (Corresponding to claim 3).

According to a fourth aspect of the invention, there is provided a reflection reversed type surface acoustic wave converter, wherein, in a unit segment of IDT electrodes disposed on a piezoelectric substrate, a combined vector which is a combination of reflection vectors from each end surface of each electrode finger within the segment has a positive phase. (Corresponding to claim 4).

BEST MODE FOR CARRYING OUT THE INVENTION

Embodiments of the present invention will be explained in detail below with reference to the drawings.

Figure 6A:
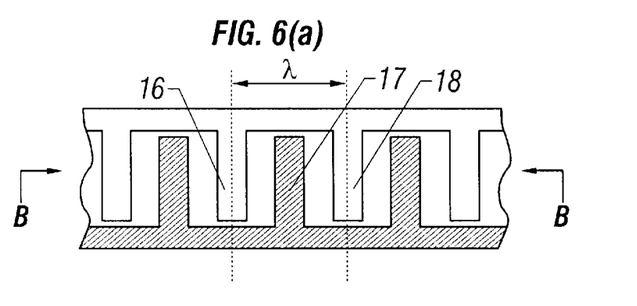
FIG. 6(a) is a top plan view for showing a part of a normal IDT electrode of an infinite periodic structure.

In order to facilitate understanding the present invention, the operation principle of a normal IDT electrodes will be briefly explained at first. FIG. 6(a) shows one example of a structure of normal IDT electrodes disposed on a piezoelectric substrate along a propagation direction of an acoustic surface wave. Each IDT electrode is structured by a pair of comb electrodes having a plurality of electrode fingers mutually inserting into the other each other.

Figure 6B:
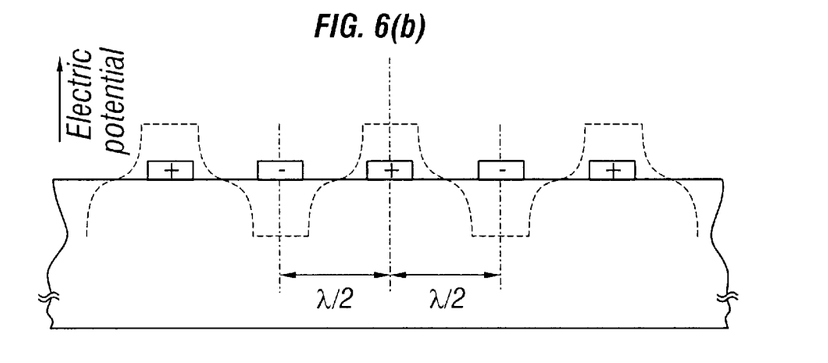
FIG. 6(b) is a cross-sectional view for showing a surface electric potential on the electrode.

In this Figure, a symbol $\lambda$ denotes a wavelength of a surface wave excited by the IDT electrodes. The wavelength $\lambda$ corresponds to a distance from a center of an electrode finger 16 to a center of an electrode finger 18 of any optional continuous electrode fingers of the IDT electrodes. FIG. 6(b) is a cross-sectional view of a portion cut along B—B of FIG. 6(a), and this shows in a broken line a surface electric potential at a certain moment when the IDT electrodes are driven by applying a high-frequency voltage to between the comb electrodes. The normal IDT electrodes are arranged with electrode fingers of the same width in a period of $\lambda/2$. A reflection coefficient Γ2 (a reflection vector) per one pair (that is, one basic unit structured by two electrode fingers) based on the center of an optional IDT electrode finger as a reference will be explained based on FIG. 7(a) and FIG. 7(b).

Figure 7A:
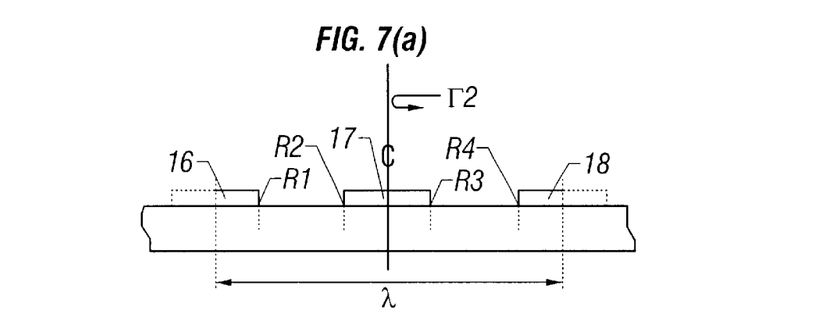
FIG. 7(a) is a view for showing four reflection surfaces R1 to R4 in one wavelength distance of a normal IDT electrode.
Figure 7B:
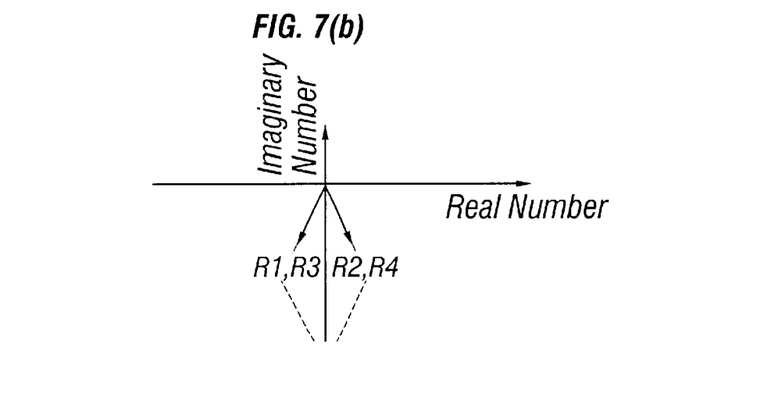
FIG. 7(b) is a view for showing reflection vectors R1 to R4 on the four reflection surfaces and a combined vector Γ2 thereof.

As shown in FIG. 7(a), in considering a reflection of one wave $\lambda$ of an optional IDT electrode, edge surfaces of the electrode fingers vertical to the piezoelectric substrate are assumed as R1 to R4. (In this case, it is assumed that the symbols R1 to R4 denote the edge surfaces as well as reflection vectors from the edge surfaces.) The reflection vectors from these four edge surfaces R1 to R4 have the following relationship as shown in FIG. 7(b). The reflection vectors R1 and R3 from the edge surfaces R1 and R3 are equal to each other. That is, they have the same sizes and the same phase angles. The reflection vectors R2 and R4 from the edge surfaces R2 and R4 are equal to each other. Accordingly, as shown in FIG. 7(b), a reflection vector after having combined the four reflection vectors R1 to R4 becomes the reflection vector Γ2 per one basic unit (that is, one pair), and the phase becomes $-\pi/2$ when the center of the electrode fingers is set as a reference.

In other words, as a reflection center is defined as a position where the phase of the reflection coefficient Γ2 becomes $-\pi/2$, the reflection center is positioned at the center of each electrode finger. It is well known that a stop band is formed for a periodical reflection in a periodical structure having arranged a large number of these normal IDT electrode fingers, such as an SAW resonator, an SAW resonance filter, etc. This structure means that a surface wave having a frequency within the stop band cannot be propagated and a standing wave is formed. By utilizing this resonance state, the SAW resonator and the SAW filter are structured.

Figure 8:
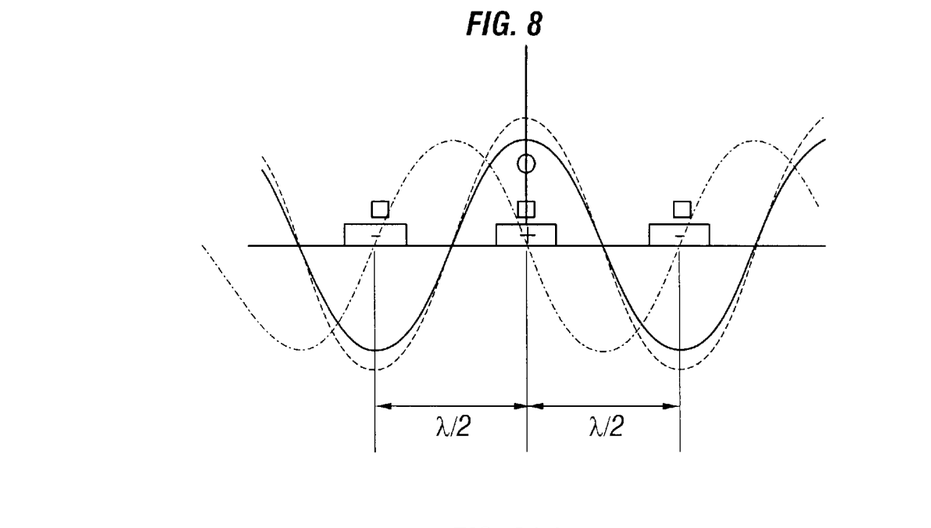
FIG. 8 is a view for showing a standing wave at a lower end (a solid line), a standing wave at a top end (a one-dot chain line), a driving force distribution curve (a broken line), an excitation center (a ○ mark) and a reflection center (a □ mark) respectively of a stop band formed by the normal IDT electrodes.

As shown in "The method of analyzing characteristics of IDT using the mode coupling theory", pp. 87–94, 1992, the 21st EM symposium, in the frequencies at a lower end (a lower limit) and an upper end (an upper limit) of a stop band formed by normal IDT electrodes, positions of an antinode (or a node) of their respective standing waves are deviated by $\pi/2$. FIG. 8 is a view for showing distributions of the respective standing waves at both ends (the lower end and the upper end) of the stop band of the normal IDT electrodes. A standing wave at the lower end of the stop band represented by the solid line becomes an antinode at a center position of the electrode finger or at a reflection center position. A standing wave at the upper end of the stop band represented by the one-dot chain line becomes a node at a reflection center position. The standing wave at the upper end of the stop band represented by the one-dot chain line is not excited in an infinite periodic structure. However, in the case of a finite length structure like an actual IDT structure, this standing wave is excited although it is weaker than the standing wave at the lower end of the stop band.

On the other hand, a driving force (a force for generating a mechanical displacement by a voltage applied to a comb electrode) for exciting a surface wave (wavelength λ) becomes a minimum dimensional component when the surface electric potential distribution shown in FIG. 6(b) is expanded in Fourier series, as is well known. A driving force obtained by calculation becomes a sinusoidal wave of a period λ, as represented by a broken line in FIG. 8. A □ mark in FIG. 8 shows a center of the reflection and a ○ mark shows a center of the excitation.

As illustrated in FIG. 8, when the excitation center (the ○ mark) and the reflection center (the □ mark) are superimposed with each other, the standing wave at the lower end of the stop band represented by the solid line becomes in-phase with the driving force distribution represented by the broken line, so that the standing wave is excited strongly.

As explained above, according to the conventional logitudinally coupled multi mode SAW filter using the normal IDT, a lowest order resonance frequency (f1) at the lower end of a stop band exited strongly and a resonance frequency (fn) in a higher order longitudinal resonance mode are used to structure a filter. It has already been confirmed by experiments and by simulation that the higher order longitudinal resonance mode has its lowest order near the lower end of the stop band and is exited at a low frequency as the mode becomes a higher order.

Figure 9A:
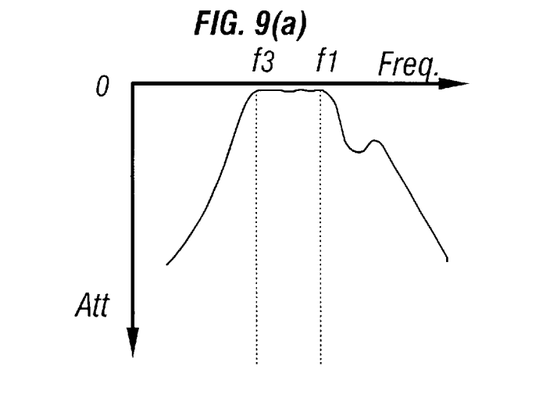
FIG. 9(a) is a view for showing filtering characteristics of the primary-third order longitudinally coupled mode SAW filter.
Figure 9B:
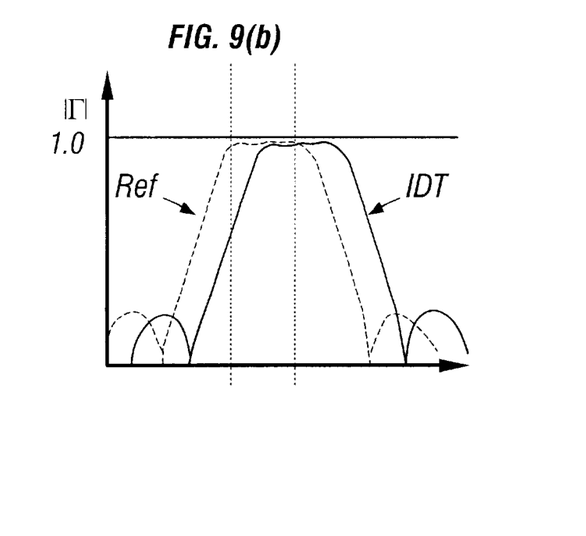
FIG. 9(b) is a view for showing a relationship between a reflection coefficient according to the IDT electrodes and a reflection coefficient according to the reflectors and resonance frequencies f1 and f3 of the primary-third order longitudinal resonance modes.

FIG. 9(a) and 9(b) schematically show the filtering characteristics of the double mode SAW filter using the resonance frequencies f1 and f3, and a relationship between a reflection coefficient according to the IDT electrodes and a reflection coefficient Γ according to reflectors Ref. In order to set the pitch of the reflectors larger than the pitch of the IDT's, the center frequency of the reflection coefficient of the reflectors is set lower than the center frequency of the IDT's.

Figure 1A:
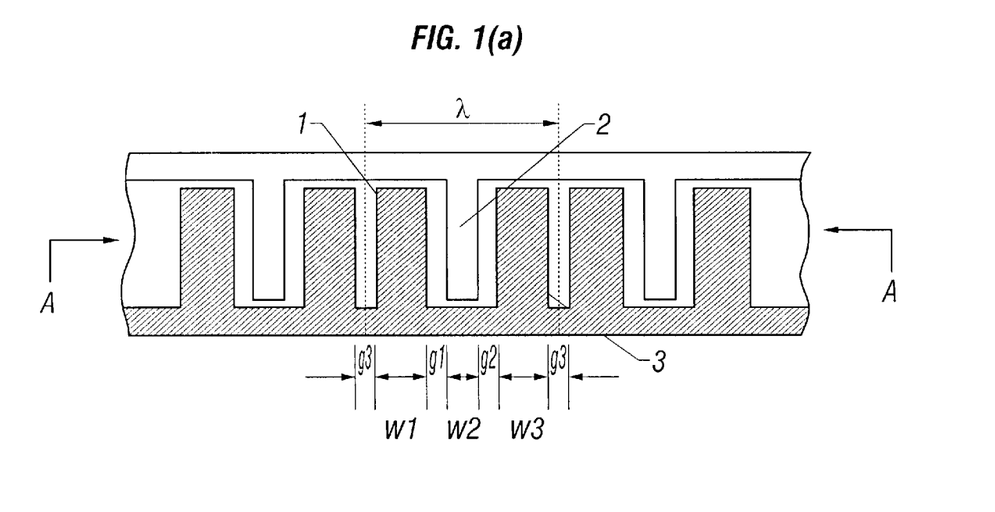
FIG. 1(a) is a top plan view for showing a part of an electrode structure of the present invention.

FIG. 1(a) is a top plan view for showing one example of an IDT electrode structure relating to the present invention. This has a layout of a repetition of a plurality of unit segments formed on a piezoelectric substrate, each segment comprising: a first electrode finger 1 having a width W1; a second electrode finger 2 having a width W2 disposed on the right side of the first electrode finger 1 with a gap g1; a third electrode finger 3 having a width W3 disposed on the right side of the second electrode finger 2 with a gap g2; and a space of (g3)/2 disposed on both end sides of the first electrode finger and the third electrode finger respectively. In other words, a unit segment structured by three electrode fingers per one wavelength of λ is arranged repeatedly on the piezoelectric substrate.

Further, the width W1 of the first electrode finger 1 and the width W3 of the third electrode finger 3 are set equal to each other. The gap g1 between the first electrode finger 1 and the second electrode finger 2 and the gap g2 between the second electrode finger 2 and the third electrode finger 3 are set equal to each other. Furthermore, the electrode fingers 1 and 3 are set in a phase opposite to a phase of the electrode finger 2 for driving.

Figure 1B:
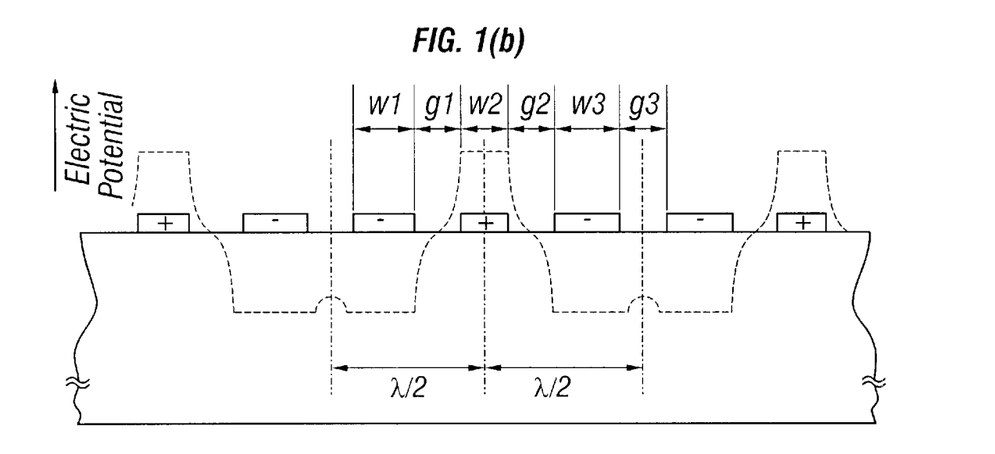
FIG. 1(b) is cross-sectional view for showing a surface electric potential on this electrode.
Figure 2A:
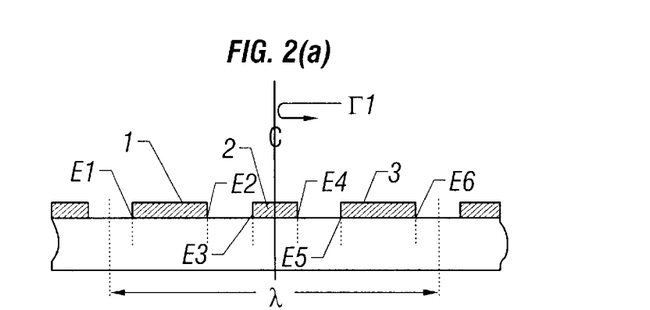
FIG. 2(a) shows six edge surfaces of three IDT electrodes arranged in one wavelength distance relating to the present invention.
Figure 2B:
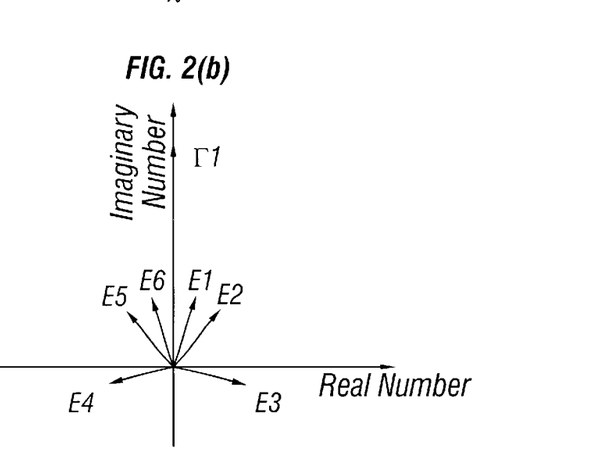
FIG. 2(b) shows reflection vectors E1 to E6 on the six edge surfaces and a combined vector Γ1 thereof.

FIG. 1(b) is a cross-sectional view cut along A—A in FIG. 1(a). This shows a surface electric potential at a certain moment when a high-frequency voltage is applied to the comb electrodes to drive the IDT electrodes. A reflection coefficient Γ1 (a reflection vector) per unit segment of the IDT electrodes having three electrode fingers per one wavelength λ is obtained in this way. Reflection vectors per one optional segment of the IDT electrodes as shown in FIG. 2(a), that is, reflection vectors E1 to E6 from six edge surfaces E1 to E6 at both ends of the electrodes 1 to 3 respectively, are obtained. In this case, it is assumed that E1 to E6 represents both an edge surface and a reflection vector from this edge. Then, as shown in FIG. 2(b), six reflection vectors E1 to E6 are obtained as shown in FIG. 2(b). In this case, for the sake of comparison with FIG. 7, the center of the second electrode finger 2 is used as a reference of reflection. A combined vector of the reflection vectors E1 to E6 becomes a reflection vector Γ1 as shown in FIG. 2(b).

Figure 3:
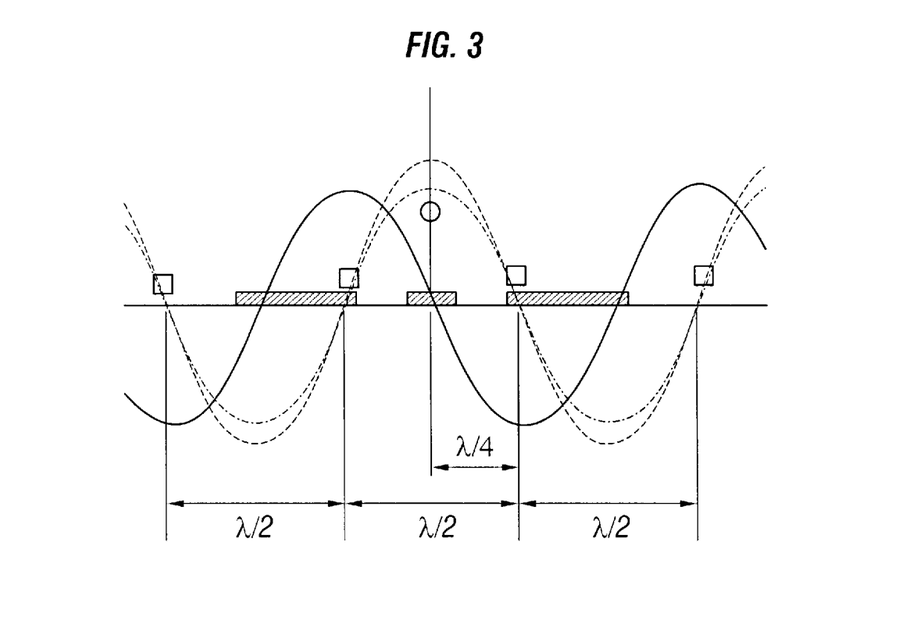
FIG. 3 is a view for showing a frequency at a lower end (a solid line), a frequency at a top end (a one-dot chain line), a driving force distribution curve (a broken line), an excitation center (a ○ mark) and a reflection center (a □ mark) respectively of a stop band formed by the IDT electrodes relating to the present invention.

The reflection vector Γ1 shows a phase of π/2 at the center of the electrode finger 2, unlike the reflection vector Γ2 of the normal IDT electrode shown in FIG. 7(b). Accordingly, both phases are different by π. As the phase rotation of a surface wave includes a return period, a spatial position of the reflection center due to this phase difference becomes a position λ/4 spatially away from the center of the electrode finger 2. In other words, according to the IDT electrode relating to the present invention, distributions of standing waves in the frequencies at the upper end and the lower end of the stop band respectively become as shown in FIG. 3. In FIG. 3, a solid line represents a standing wave in the frequency at the lower end of the stop band and a one-dot chain line represents a standing wave in the frequency at the upper end of the stop band.

As is clear from the comparison with FIG. 8, as the reflection center has deviated by λ/4 to the excitation center, the distribution of each standing wave has also deviated by λ/4. As a result, the positional relationship of the anti-nodes and nodes of each standing wave with respect to the driving force distribution in FIG. 3 has been replaced from the pattern shown in FIG. 8.

On the other hand, a minimum dimensional component when the surface electric potential distribution shown in FIG. 1(b) is expanded in Fourier series becomes a driving force, as explained above. A driving force distribution obtained by this calculation becomes a sinusoidal wave as represented by a broken line in FIG. 3. As is clear from FIG. 3, the excitation center (a ○ mark) is positioned at the center of the second electrode finger, and the reflection center (a □ mark) becomes a position deviated by λ/4 from the center of the second electrode finger 2.

Accordingly, as the anti-node of the standing wave in the frequency at the upper end of the stop band represented by a one-point chain line coincides with the excitation center, the frequency at the upper end of the stop band is excited strongly. On the other hand, the node of the standing wave in the frequency at the lower end of the stop band represented by the solid line coincides with the excitation center, and this indicates that the standing wave is not excited in an infinite periodic structure.

However, in the actual finite periodic structure, the standing wave at the lower end of the stop band represented by the solid line is excited although it is weaker than the standing wave at the upper end of the stop band represented by the one-point chain line. When the IDT electrode structure relating to the present invention is used, the standing wave at the upper end of the stop band is excited strongly. Based on a result of simulations, the higher order longitudinal resonance mode of the frequency at the upper end of the stop band appears in a higher frequency as the order is higher.

Therefore, it is possible to structure a longitudinally coupled multi mode SAW filter by using a plurality of lowest longitudinally coupled resonance mode and higher order longitudinally coupled resonance mode.

Figure 1C:
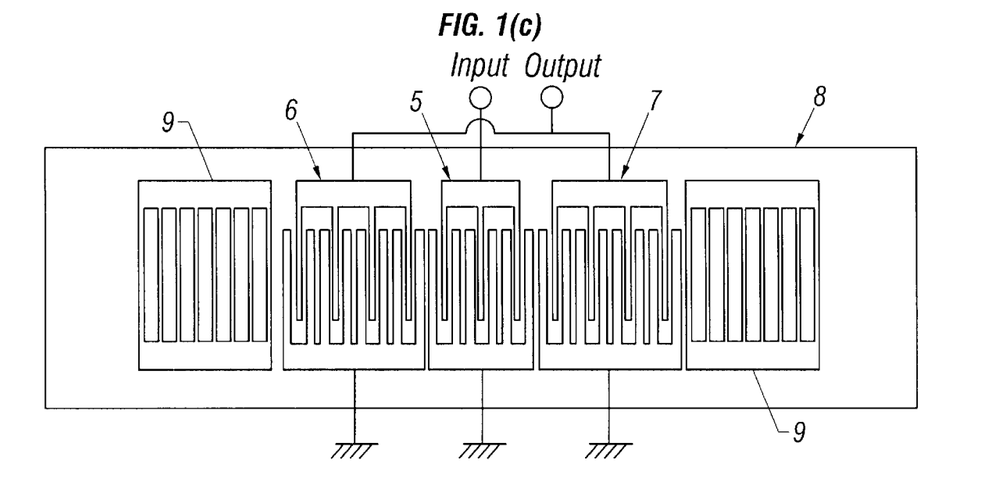
FIG. 1(c) is a top plan view for showing the structure of the longitudinally coupled multi mode SAW filter that uses the electrode structure relating to the present invention.

FIG. 1(c) is a top plan view for showing the structure of the longitudinally coupled multi mode SAW filter that uses the electrode structure relating to the present invention. In this longitudinally coupled multi mode SAW filter, three IDT electrodes 5, 6 and 7 are disposed close to each other on a piezoelectric substrate 8 and arranged along a propagation direction of a surface wave. In addition, reflectors 9 are respectively provided on the outer side of the IDT electrodes 6 and 7.

Figure 4:
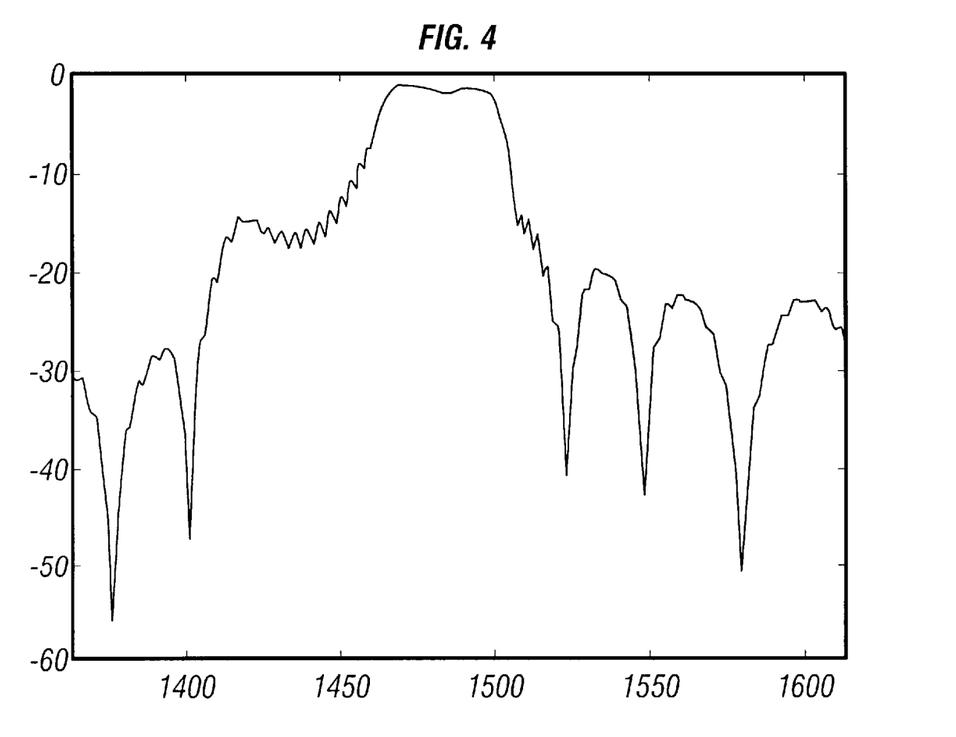
FIG. 4 is a diagram for showing frequency characteristics of a longitudinally coupled mode SAW filter structured by using the IDT electrodes relating to the present invention.

FIG. 4 shows frequency characteristics of the longitudinally coupled multi mode SAW filter structured by having the IDTs relating to the present invention as shown in FIG. 1(c).

Parameters of the filter having the frequency characteristics shown in FIG. 4 are as follows. While positive and negative electrode fingers form one pair in the normal filter shown in FIG. 5(b), the three electrode fingers (per one wavelength $\lambda$) in the IDT electrodes of the present invention correspond to the one pair in the normal filter. Pitch $L_R$ of the reflectors is constant for both the filter shown in FIG. 5(b) and the filter having the frequency characteristics shown in FIG. 4. A ratio of the pitch of the IDT's to the pitch of the reflectors, $L_t/L_R$, is set to 1.015 in the case of the filter having the frequency characteristics shown in FIG. 4. All the other parameters of the filter having the frequency characteristics shown in FIG. 4 are the same as those of the filter shown in FIG. 5(b). However, in the present embodiment, the width W2 of the second electrode finger is set smaller than the width W1 of the first electrode finger or the width W3 of the third electrode finger (W1=W3), that is, W1=W3>W2.

As a pass band according to the present invention is formed by utilizing a plurality of resonance modes at a high side of the stop band formed by the IDT electrodes, the shape factor at a high-pass side near the passing area is improved substantially, unlike the conventional filter shown in FIG. 5(b).

At a low-pass side near the pass band, an attenuation level decreasing characteristics appears as the same as the attenuation level decreasing characteristics at high-pass side near the pass band of the conventional multi mode SAW filter.

As explained above, when the reflection center position is deviated by $\pi/2$, that is, when the phase of the reflection combined-vector is changed by $\pi$, with the excitation center unchanged, the roles of the upper end and the lower end of the stop band shown by the normal IDT electrodes become opposite to the roles of the upper end and the lower end of the stop band shown by the IDT electrodes relating to the present invention. In other words, it is possible to realize a filter or a resonator having frequency characteristics that are the replacement of the characteristics between the upper end frequency and the lower end frequency of the stop band of the normal IDT electrodes.

When the IDT electrodes of the present invention are applied to the longitudinally coupled multi mode SAW filter, it is possible to realize a filter that solves the attenuation level decreasing so far generated at the high-pass side near the pass band.

Accordingly, when there is a demand for a filter that requires a high attenuation level at a high-pass side near the pass band, the use of the IDT electrodes of the present invention can easily meet the demanded characteristics without a cascade connection structure as was the case with the conventional technique. Further, it is also possible to solve a high insertion loss due to the conventional cascade connection, by a longitudinally coupled multi mode SAW filter using the IDT electrodes of the present invention.

Further, when the longitudinally coupled multi mode SAW filter using the IDT electrodes of the present invention and the longitudinally coupled multi mode SAW filter using the conventional normal electrodes are connected in cascade, it is possible to realize a filter having a good shape factor, sharp cutoff characteristics in both vicinities of the pass bands. A composite type filter having the above-described structure guarantees sufficient attenuation in a frequency at a distance from the center frequency, unlike the ladder type filter.

The explanation of the above-described sinusoidal wave and the frequency characteristics of the standing wave at the upper and lower ends of the stop band relates to a combination of a piezoelectric substrate and electrode materials so as to coincide the electrode finger center and a reflection center (that is, the phase of the reflection coefficient becomes $-\pi/2$ at the center of the electrode finger) in the normal IDT electrodes.

However, in the case of a combination of the electrode made of aluminum and 128° Y-cut X-propagation LiNbO$_3$, for example, the reflection center becomes a position at a distance of $\lambda/4$ from the electrode finger center, that is at the center of the space, in the case of the normal IDT electrodes as well, when the electrode film thickness is approximately 3.5% $\lambda$ or above. In this case, only the operation of the upper end and the lower end of the stop band changes in the normal IDT electrodes and the reflection inversion electrodes proposed this time. Complementary relationship and utilization value of both types of electrodes remain unchanged.

With the above-described structure, a longitudinally coupled multi mode SAW filter using the IDT electrodes of the present invention exhibits a satisfactory shape factor at a high-pass side near the pass band. Further, by a cascade connection of the longitudinally coupled multi mode SAW filter structured by using the normal IDT's and the longitudinally coupled multi mode SAW filter structured by using the IDT electrodes of the present invention, it is possible to form a filter having substantially improved the shape factor near the pass band. This exhibits a remarkable effect in manufacturing the SAW filter.

What is claimed is:

1. A reflection reversed type surface acoustic wave transducer, wherein a surface acoustic wave transducer is structured by a repetition of a plurality of unit segments formed on a piezoelectric substrate, each segment comprising:

a first electrode finger having a width W1; a second electrode finger having a width W2 disposed adjacent to the first electrode finger with a gap g1;

a third electrode finger having a width W3 disposed adjacent to the second electrode finger with a gap g2; and a space of (g3)/2 disposed adjacent said first electrode finger and opposite side of said gap g1;

a space of (g3)/2 disposed adjacent said third electrode finger and opposite side of said gap g2; wherein said first and third electrode fingers are driven by AC signal in-phase respectively, and said second electrode finger is driven by AC signal which is an opposite phase with said AC signal applied to said first and third electrode fingers, the width W1 of the first electrode finger and the width W3 of the third electrode finger are set equal to each other, the gap g1 and the gap g2 are set equal to each other, and except the condition that W1=W2 and g1=g3.

2. A longitudinally coupled multi mode SAW filter, wherein a plurality of reflection reversed type surface acoustic wave transducers according to claim 1 are disposed close to each other along a propagation direction of a surface wave, and reflectors are disposed adjacent outermost reflection reversed type surface acoustic wave transducers.

3. A longitudinally coupled multi mode SAW filter, wherein a plurality of reflection reversed type surface acoustic wave transducers according to claim 1 are disposed close to each other along a propagation direction of a surface wave, and reflectors are disposed adjacent outermost reflection reversed type surface acoustic wave transducers, and a ratio of a pitch of the reflectors to a pitch of the surface wave transducers or IDT's is set larger than 1.

4. A reflection reversed type surface acoustic wave transducer according to claim 1 wherein, a reflection combined-vector ($\Gamma 1$) of the reflection reversed type surface acoustic wave transducer at an excitation center is different substantially 180 degrees from a reflection combined-vector ($\Gamma 2$) at an excitation center wherein in each unit segment IDT electrodes are disposed on the same piezoelectric substrate.

* * * * *